United States Patent [19]

Saito

[11] Patent Number: 6,064,227
[45] Date of Patent: May 16, 2000

[54] OUTPUT BUFFER CIRCUIT HAVING LOW BREAKDOWN VOLTAGE

[75] Inventor: Toshiaki Saito, Tokyo, Japan

[73] Assignee: NEC Corporation, Tokyo, Japan

[21] Appl. No.: 09/059,248

[22] Filed: Apr. 14, 1998

[30] Foreign Application Priority Data

Apr. 18, 1997 [JP] Japan .................................. 9-116493

[51] Int. Cl.⁷ ........................ H03K 19/094; H03K 19/00; H03K 19/0175; H03K 19/20; G05K 3/02
[52] U.S. Cl. ............................ 326/68; 326/57; 326/80; 326/83; 326/112; 327/543
[58] Field of Search ............................ 326/68, 80–83, 326/86, 57, 112, 119, 121; 327/541, 543, 530; 323/315

[56] References Cited

U.S. PATENT DOCUMENTS

| | | | |
|---|---|---|---|
| 5,539,334 | 7/1996 | Clapp, III et al. | 326/68 |
| 5,565,811 | 10/1996 | Park et al. | 327/546 |
| 5,684,415 | 11/1997 | McManus | 326/81 |
| 5,729,155 | 3/1998 | Kobatake | 326/68 |
| 5,798,637 | 8/1998 | Kim et al. | 323/313 |

FOREIGN PATENT DOCUMENTS 4-236516  8/1992  Japan .

*Primary Examiner*—Michael Tokar
*Assistant Examiner*—James H Cho
*Attorney, Agent, or Firm*—Young & Thompson

[57] ABSTRACT

In an output buffer circuit, a logic circuit generates first and second data signals each having a voltage level between a low voltage and a first high voltage. A level shift circuit receives the first data signal and generates a third data signal having a voltage between a first intermediate voltage and a second high voltage higher than the first high voltage. An output circuit includes first and second P-channel MOS transistors and first and second N-channel MOS transistors powered by the low voltage and the second high voltage, a gate of the first P-channel MOS transistor receives the third data signal, a gate of the second P-channel MOS transistor receives a second intermediate voltage between the low voltage and the second high voltage, a gate of the first N-channel MOS transistor receives the data signal, and a gate of the second N-channel MOS transistor receives a third intermediate voltage.

18 Claims, 7 Drawing Sheets

Fig. 2 PRIOR ART

| EN | $D_{in}$ | $D_1$ | $D_2$ | $D_1'$ | $D_2'$ | $D_{out}$ |
|---|---|---|---|---|---|---|
| 0V | — | $V_{DDL}$ | 0V | $V_{DDH}$ | 0V | Hz |
| $V_{DDL}$ | 0V | $V_{DDL}$ | $V_{DDL}$ | $V_{DDH}$ | $V_{DDH}$ | 0V |
| $V_{DDL}$ | $V_{DDL}$ | 0V | 0V | 0V | 0V | $V_{DDH}$ |

Fig. 4

| STATE | EN | $D_{in}$ | $D_1$ | $D_2$ | $D_1'$ | $D_2$ | $N_{301}$ | $D_{out}$ | $N_{302}$ |
|---|---|---|---|---|---|---|---|---|---|
| I | 0V | — | $V_{DDL}$ | 0V | $V_{DDH}$ | 0V | Hz | Hz | Hz |
| II | $V_{DDL}$ | 0V | $V_{DDL}$ | $V_{DDL}$ | $V_{DDH}$ | $V_{DDL}$ | $V_{PM}+|V_{thp}|$ | 0V | 0V |
| III | $V_{DDL}$ | $V_{DDL}$ | 0V | 0V | $V_{PM}+|V_{thp}|$ | 0V | $V_{DDH}$ | $V_{DDH}$ | $V_{DDL}-V_{thn}$ |

Fig. 7

| STATE | EN | $D_{in}$ | $D_1$ | $D_2$ | $D_1'$ | $D_2$ | $N_{301}$ | $D_{out}$ | $N_{302}$ |
|---|---|---|---|---|---|---|---|---|---|
| I | 0V | — | $V_{DDL}$ | 0V | $V_{DDH}$ | 0V | Hz | Hz | Hz |
| II | $V_{DDL}$ | 0V | $V_{DDL}$ | $V_{DDL}$ | $V_{DDH}$ | $V_{DDL}$ | $V_{PM}+|V_{thp}|$ | 0V | 0V |
| III | $V_{DDL}$ | $V_{DDL}$ | 0V | 0V | $|V_{PM}+|V_{thp}||$ | 0V | $V_{DDH}$ | $V_{DDH}$ | $V_{NM}-V_{thn}$ |

ര, 064,227

1

OUTPUT BUFFER CIRCUIT HAVING LOW BREAKDOWN VOLTAGE

BACKGROUND OF THE INVENTION

1. Field of the Invention

The present invention relates to a semiconductor device, and more particularly, to an output buffer circuit of the semiconductor device.

2. Description of the Related Art

A prior art output buffer circuit is constructed by a logic circuit for generating first and second data signals each having a voltage level between a ground level GND and a high voltage $V_{DDL}$ such as 3V, level shift circuits for changing the high voltage level (=$V_{DDL}$) of the first and second data signals to a higher voltage level $V_{DDH}$ such as 5V, and an output circuit formed by a P-channel metal oxide semiconductor (MOS) transistor and an N-channel MOS transistor powered by the ground level GND and the high voltage $V_{DDH}$. The P-channel MOS transistor is controlled by the level-shifted first data signal, and the N-channel MOS transistor is controlled by the level-shifted second data signal. Thus, an output signal having a voltage level between the ground level GND and the high voltage $V_{DDH}$ is obtained from the output circuit. This will be explained later in detail.

In the above-mentioned prior art output buffer circuit the voltage $V_{DDH}$, which is larger than the maximum voltage $V_{DDL}$ within an internal circuit including the control circuit and the level shift circuits, is applied between the gate and source (the gate and drain) of each of the transistors of the output circuit. Therefore, if the breakdown voltage of the transistors of the output circuit has the same breakdown voltage as the transistors within the internal circuit, the transistors are so deteriorated that the reliability of the semiconductor device is reduced.

In order to enhance the reliability of the semiconductor device, a special manufacturing process different from a manufacturing process for the internal circuit is performed upon the output circuit. For example, the gate silicon oxide layer of the transistors of the output circuit is made thicker than that of the transistors within the internal circuit, which, however, increases the manufacturing cost.

SUMMARY OF THE INVENTION

It is an object of the present invention to provide an output buffer circuit including an output circuit having a low breakdown voltage, thus decreasing the manufacturing cost.

According to the present invention, in an output buffer circuit, a logic circuit generates first and second data signals each having a voltage level between a low voltage and a first high voltage. A level shift circuit receives the first data signal and generates a third data signal having a voltage between a first intermediate voltage and a second high voltage higher than the first voltage. An output circuit includes first and second P-channel MOS transistors and first and second N-channel MOS transistors powered by the low voltage and the second high voltage. A gate of the first P-channel MOS transistor receives the third data signal, a gate of the second P-channel MOS transistor receives a second intermediate voltage between the low voltage and the second high voltage, a gate of the first N-channel MOS transistor receives the second data signal, and a gate of the second N-channel MOS transistor receives a third intermediate voltage.

The source-gate (gate-drain) voltage of each of the transistors of the output circuit is smaller than the difference between the low voltage and the second high voltage.

2

BRIEF DESCRIPTION OF THE DRAWINGS

The present invention will be more clearly understood from the description as set forth below, as compared with the prior art, with reference to the accompanying drawings, wherein:

FIG. 2 is a table showing the relationship among the signals of the circuit of FIG. 1;

FIG. 4 is a table showing the relationship among the signals of FIG. 3;

FIG. 7 is a table showing the relationship among the signals of FIG. 6.

DESCRIPTION OF THE PREFERRED EMBODIMENTS

Before the description of the preferred embodiments, a prior art output buffer circuit will be explained with reference to FIGS. 1 and 2.

Figure 1:
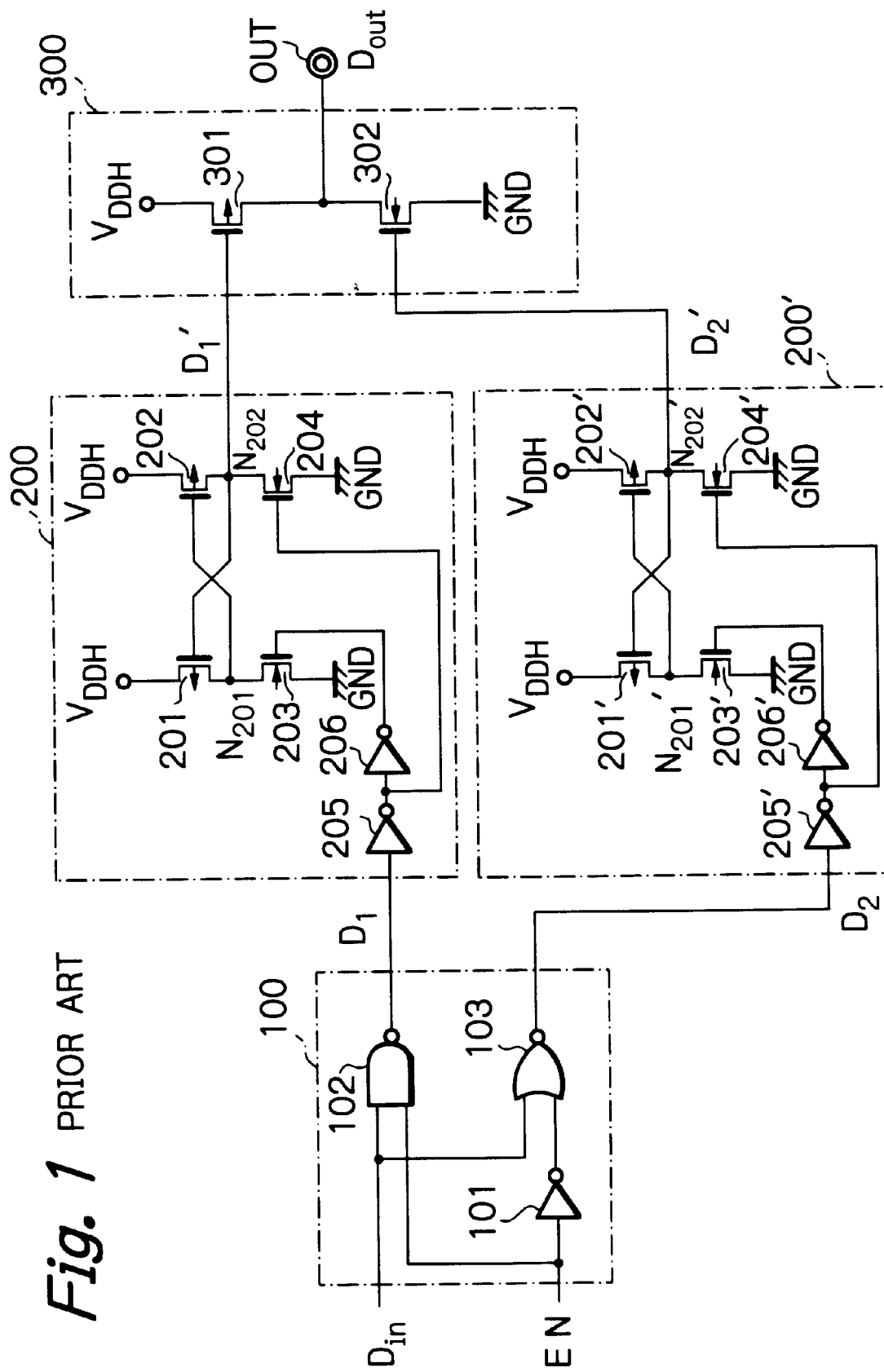
FIG. 1 is a circuit diagram illustrating a prior art output buffer circuit.

In FIG. 1, reference numeral 100 designates a control circuit for generating output signals $D_1$ and $D_2$ in accordance with an input data signal $D_{in}$. The control circuit 100 is enabled by an enable signal EN. The control circuit 100 includes an inverter 101 for receiving the enable signal EN, a NAND circuit 102 for receiving the input data signal $D_{in}$ and the enable signal EN to generate a data signal $D_1$, and a NOR circuit 103 for receiving the input data signal $D_{in}$ and the output signal of the inverter 101 to generate a data signal $D_2$.

The control circuit 100 is powered by a power supply voltage $V_{DDL}$ such as 3V. In this case, as shown in FIG. 2, when the enable signal EN is low (=0V), the data signals $D_1$ and $D_2$ are $V_{DDL}$ and 0V, respectively, regardless of the input data signal $D_{in}$. On the other hand, as shown in FIG. 2, when the enable signal EN is high (=$V_{DDL}$) and the input data signal $D_{in}$ is low (=0V), the data signals $D_1$ and $D_2$ are both $V_{DDL}$, while, when the enable signal EN is high (=$V_{DDL}$) and the input data signal $D_{in}$ is high (=$V_{DDL}$), the data signals $D_1$ and $D_2$ are both 0V.

A level shift circuit 200 is provided to receive the data signal $D_1$ of the control circuit 100. That is, the high level (=$V_{DDL}$) of the data signal $D_1$ is pulled by the level shift circuit 200 to a power supply voltage $V_{DDH}$ such as 5V. The level shift circuit 200 includes cross-coupled P-channel MOS transistors 201 and 202, switching N-channel MOS transistors 203 and 204, and inverters 205 and 206. The level shift circuit 200 is powered by the power supply voltage $V_{DDH}$.

When the data signal $D_1$ is low (=0V), the transistors 203 and 204 are turned OFF and ON, respectively. As a result, the voltages at nodes $N_{201}$ and $N_{202}$ are made higher and lower, respectively, so that the transistors 201 and 202 are turned ON and OFF, respectively. Thus, the voltage at the node $N_{202}$ becomes 0V, and therefore, a data signal $D_1$' becomes 0V.

On the other hand, when the data signal $D_1$ is high (=$V_{DDL}$), the transistors 203 and 204 are turned ON and OFF, respectively, As a result, the voltages at nodes $N_{201}$ and $N_{202}$ are made lower and higher, respectively, so that the transistors 201 and 202 are turned OFF and ON, respectively. Thus, the voltage at the node $N_{202}$ becomes $V_{DDL}$, and therefore, the data signal $D_1'$ becomes $V_{DDH}$.

Also, the level shift circuit 200' is provided to receive the data signal $D_2$ of the control circuit 100 to generate a data signal $D_2'$. The level shift circuit 200' has the same configuration as the level shift circuit 200. Therefore, when the data signal $D_2$ is low (=0V), the data signal $D_2'$ is low (=0V), and when the data signal $D_2$ is high (=$V_{DDL}$), the data signal $D_2'$ is high (=$V_{DDH}$).

Thus, in the relationship between the data signals $D_1$ and $D_2$ and the data signals $D_1'$ and $D_2'$ as shown in FIG. 2, the high level voltage $V_{DDL}$ is changed to the high level voltage $V_{DDH}$.

An output circuit 300 receives the data signals $D_1'$ and $D_2'$ to generate an output data signal $D_{out}$ at an output terminal OUT. The output circuit 300 includes a P-channel MOS transistor 301 and an N-channel MOS transistor 302.

The output circuit 300 is powered by the power supply voltage $V_{DDH}$. Therefore, when the data signals $D_1'$ and $D_2'$ are high (=$V_{DDH}$) and low (=0V), respectively, the output data signal $D_{out}$ is in a high impedance state. When the data signals $D_1'$ and $D_2'$ are both high (=$V_{DDH}$), the output data signal $D_{out}$ is low (=0V), while, when the data signals $D_1'$ and $D_2'$ are both low (=0V), the output data signal $D_{out}$ is high (=$V_{DDH}$).

The relationship among the enable signal EN, the input data signal $D_{in}$ and the output data signal $D_{out}$ is shown in FIG. 2.

In the output buffer circuit of FIG. 1, note that a state where $(D_1', D_2')=(0V, V_{DDH})$ never occurs, so that the transistors 301 and 302 are never turned ON, simultaneously.

In the output buffer circuit of FIG. 1, a voltage $V_{DDH}$ larger than the maximum voltage $V_{DDL}$ within an internal circuit including the control circuit 100 and the level shift circuits 200 and 300 is applied between the gate and source (gate and drain) of each of the transistors 301 and 302. Therefore, if the breakdown voltage of the transistors 301 and 302 has the same breakdown voltage as the transistors within the internal circuit, the transistors 301 and 302 are so deteriorated that the reliability of a semiconductor device is reduced.

In a prior art semiconductor device, in order to enhance the reliability of the semiconductor device, a special manufacturing process different from a manufacturing process for the internal circuit is performed upon the output circuit 300. For example, the gate silicon oxide layer of the transistors 301 and 302 is made thicker than that of the transistors within the internal circuit, which, however, increases the manufacturing cost.

Figure 3:
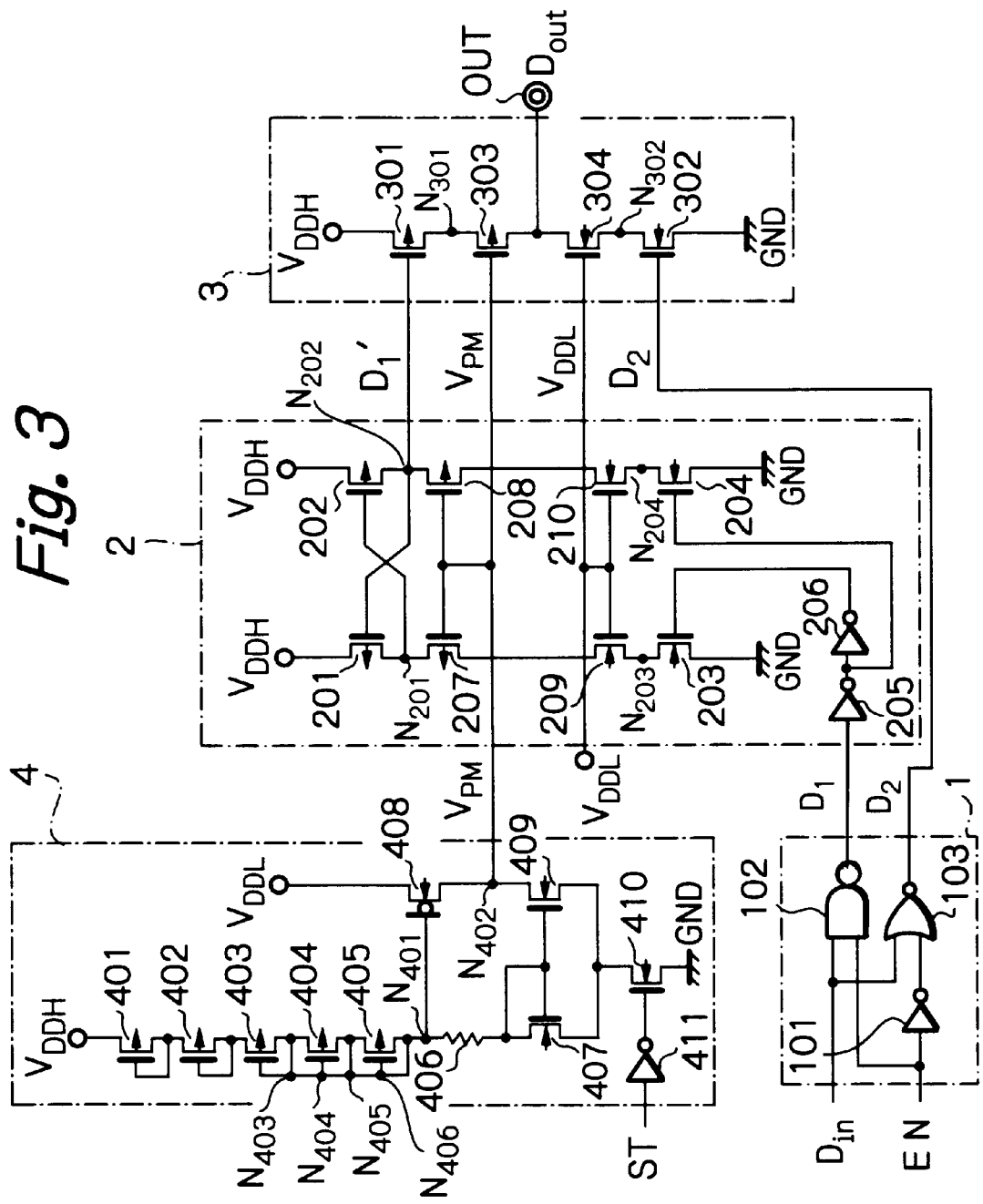
FIG. 3 is a circuit diagram illustrating a first embodiment of the output buffer circuit according to the present invention.

In FIG. 3, which illustrates a first embodiment of the present invention, an output buffer circuit is constructed by a control circuit 1, a level shift circuit 2, an output circuit 3 and an intermediate voltage generating circuit 4.

The control circuit 1 has the same configuration as the control circuit 100 of FIG. 1. That is, the control circuit 1 generates data signals $D_1$ and $D_2$, so that the data signal $D_1$ is supplied to the level shift circuit 2 and the data signal $D_2$ is supplied directly to the output circuit 3.

The intermediate voltage generating circuit 4 generates an intermediate voltage $V_{PM}$ and transmits it to the level shift circuit 2 and the output circuit 3.

The intermediate voltage generating circuit 4 is constructed by a series of P-channel MOS transistors 401 through 405, a resistor 406 and a N-channel MOS transistor 407 on the side of the power supply voltage $V_{DDH}$. In this case, the transistors 401, 402 and 403 are diode-connected, and the transistors 404 and 405 are short-circuited. Also, the intermediate voltage generating circuit 4 is constructed by a non-doped N-channel MOS transistor 408 and an N-channel MOS transistor 409 on the side of the power supply voltage $V_{DDL}$. The gate of the transistor 408 is controlled by the voltage at a node $N_{401}$ between the transistor 405 and the resistor 406 which is $$V_{DDH}-3|V_{thp}|$$

where $V_{thp}$ is a threshold voltage of the P-channel MOS transistors.

Also, the transistors 407 and 409 form a current mirror circuit.

Further, an N-channel MOS transistor 410 is connected between the sources of the transistors 407 and 409 and the ground terminal GND, and is controlled by a control signal ST through an inverter 411. Thus, in a standby state or the like (ST="1" (=$V_{DDL}$)), the transistor 410 is turned OFF, thus decreasing the power dissipation.

The intermediate voltage $V_{PM}$ is derived from a node $N_{402}$ between the transistors 408 and 409. The intermediate voltage $V_{PM}$ is about the same as the voltage at the node $N_{401}$, i.e., $$V_{PM} \approx V_{DDH}-3|V_{thp}|$$

In this case, the intermediate voltage $V_{PM}$ fluctuates in accordance with the voltage $V_{DDH}$, and satisfies the following formula:

$$V_{DDL} \geq V_{PM} \geq V_{DDH}-3|V_{thp}| \qquad (1)$$

where $V_{DDL} \geq V_{DDH}-3|V_{thp}|$

Note that, if a connection between nodes $N_{403}$ and $N_{404}$ is opened, the transistor 404 is diode-connected, and therefore, the formula (1) is replaced by $$V_{DDL} \geq V_{PM} \geq V_{DDH}-4|V_{thp}| \qquad (2)$$

In addition, if a connection between nodes $N_{405}$ and $N_{406}$ is opened, the transistor 405 is diode-connected, and therefore, the formula (2) is replaced by $$V_{DDL} \geq V_{PM} \geq V_{DDH}-5|V_{thp}| \qquad (3)$$

Thus, the intermediate voltage $V_{PM}$ can be adjusted by opening the connections between the source-gate of the transistor 404 (405) using a laser trimming method or the like.

On the other hand, the power supply voltage $V_{DDL}$ is supplied as another intermediate voltage to the level shift circuit 2 and the output circuit 3.

The level shift circuit 2 is formed by modifying the level shift circuit 200 of FIG. 1. Note that the level shift circuit 200' of FIG. 1 is not provided.

That is, in the level shift circuit 2, P-channel MOS transistors 207 and 208 controlled by the intermediate voltage $V_{PM}$ and the N-channel MOS transistors 209 and 210 controlled by the intermediate voltage $V_{DDL}$ are added to the elements of the level shift circuit 200 of FIG. 1. The transistors 207 and 209 are connected in series between the transistors 201 and 203, and the transistors 208 and 210 are connected in series between the transistors 202 and 204. Also, the level shift circuit 2 is powered by the power supply voltage $V_{DDH}$.

When the data signal $D_1$ is low (=0V), the transistors 203 and 204 are turned OFF and ON, respectively. As a result, the voltages at nodes $N_{203}$ and $N_{204}$ are made higher and lower, respectively. In this case, since the voltage at the gate of the transistor 209 is fixed at $V_{DDL}$, the voltage at the node $N_{203}$ increases up to $$V_{DDL}-V_{thn}$$

where $V_{thn}$ is a threshold voltage of the N-channel MOS transistors. Also, the voltage at the node $N_{204}$ becomes 0V, and therefore, the voltage at the node $N_{202}$ is made lower. As a result, the transistor 201 is turned ON to increase the voltage at the node $N_{201}$, thus turning OFF the transistor 202. In this case, since the voltage at the gate of the transistor 202 is fixed at $V_{PM}$, the voltage at the node $N_{202}$ decreases down to $$V_{PM}+|V_{thp}|$$

On the other hand, when the data signal $D_1$ is high (=$V_{DDL}$), the transistors 203 and 204 are turned ON and OFF, respectively. As a result, the voltages at nodes $N_{203}$ and $N_{204}$ are made lower and higher, respectively.

In this case, since the voltage at the gate of the transistor 210 is fixed at $V_{DDL}$, the voltage at the node $N_{204}$ increases up to $$V_{DDL}-V_{thn}$$

Also, the voltage at the node $N_{203}$ becomes 0V, and therefore, the voltage at the node $N_{201}$ is made lower. As a result, the transistor 202 is turned ON to increase the voltage at the node $N_{202}$, thus turning ON the transistor 202. Therefore, the voltage at the node $N_{202}$ increases up to $V_{DDH}$.

Thus, as shown in FIG. 4, the low level (=0V) of the data signal $D_1$ is changed to the low level (=$V_{PM}+|V_{thp}|$) of the data signal $D_1'$, and the high level (=$V_{DDL}$) of the data signal $D_1$ is changed to the high level (=$V_{DDH}$) of the data signal $D_1'$.

The output circuit 3 includes a P-channel MOS transistor 303 and an N-channel MOS transistor 304 in addition to the transistors 301 and 302 of the output circuit 300 of FIG. 1.

The data signal $D_1'$ is applied to the gate of the transister 301, and the intermediate voltage $V_{PM}$ is applied to the gate of the transistor 303. On the other hand, the data signal $D_2$ is applied to the gate of the transistor 302, and the voltage $V_{DDL}$ is applied to the gate of the transistor 304. The output terminal OUT is connected to a node between the transistors 303 and 304.

When the enable signal EN is low (=0V), $V_{DDH}$, 0V, $V_{PM}$ and $V_{DDL}$ are applied to the gates of the transistors 301, 302, 303 and 304, respectively. As a result, the transistors 301 and 302 are both turned OFF, so that the output signal $D_{out}$ as well as the voltage at nodes $N_{301}$ and $N_{302}$ are in a high impedance state, as shown in FIG. 4 (state I).

When the enable signal EN is high (=$V_{DDL}$) and the input data signal $D_{in}$ is low (=0V), $V_{DDH}$, $V_{DDL}$, $V_{PM}$ and $V_{DDL}$ are applied to the gates of the transistors 301, 302, 303 and 304, respectively. As a result, the transistors 301 and 302 are turned OFF and ON, respectively, so that the output data signal $D_{out}$ as well as the voltage at the node $N_{302}$ is decreased to 0V, however, the voltage at the node $N_{301}$ is decreased to $V_{PM}+|V_{thp}|$, as shown in FIG. 4 (state II). In this case, the source-gate voltage and gate-drain voltage of the transistor 301 are $$0V \quad (4)$$

$$V_{DDH}-V_{PM}-|V_{thp}| \quad (5)$$

Also, the source-gate voltage and gate-drain voltage of the transistor 303 are $$|V_{thp}| \quad (6)$$

$$V_{PM} \quad (7)$$

Any of the values (4), (5), (6) and (7) are smaller than $V_{DDH}$.

When the enable signal EN is high (=$V_{DDL}$) and the input data signal $D_{in}$ is high (=$V_{DDL}$), $V_{PM}+|V_{thp}|$, ON, $V_{PM}$ and $V_{DDL}$ are applied to the gates of the transistors 301, 302, 303 and 304, respectively. As a result, the transistors 301 and 302 are turned OFF and ON, respectively, so that the output data signal $D_{out}$ as well as the voltage at the node $N_{301}$ is increased to $V_{DDH}$, however, the voltage at the node $N_{302}$ is increased to $V_{DDL}-V_{thn}$, as shown in FIG. 4 (state III). In this case, the source-gate voltage and gate-drain voltage of the transistor 302 are $$0V \quad (8)$$

$$V_{DDL}-V_{thn} \quad (9)$$

Also, the source-gate voltage and gate-drain voltage of the transistor 304 are $$V_{thn} \quad (10)$$

$$V_{DDH}-V_{DDL} \quad (11)$$

Any of the values (8), (9), (10) and (11) are smaller than $V_{DDH}$.

Thus the transistors 301 through 304 of the output circuit 3 can have the same breakdown voltage as the internal circuit including the control circuit 1, the level shift circuit 2 and the intermediate voltage generating circuit 4. For example, the gate silicon oxide layer of the output circuit 3 can be the same as that of the internal circuit.

Figure 5:
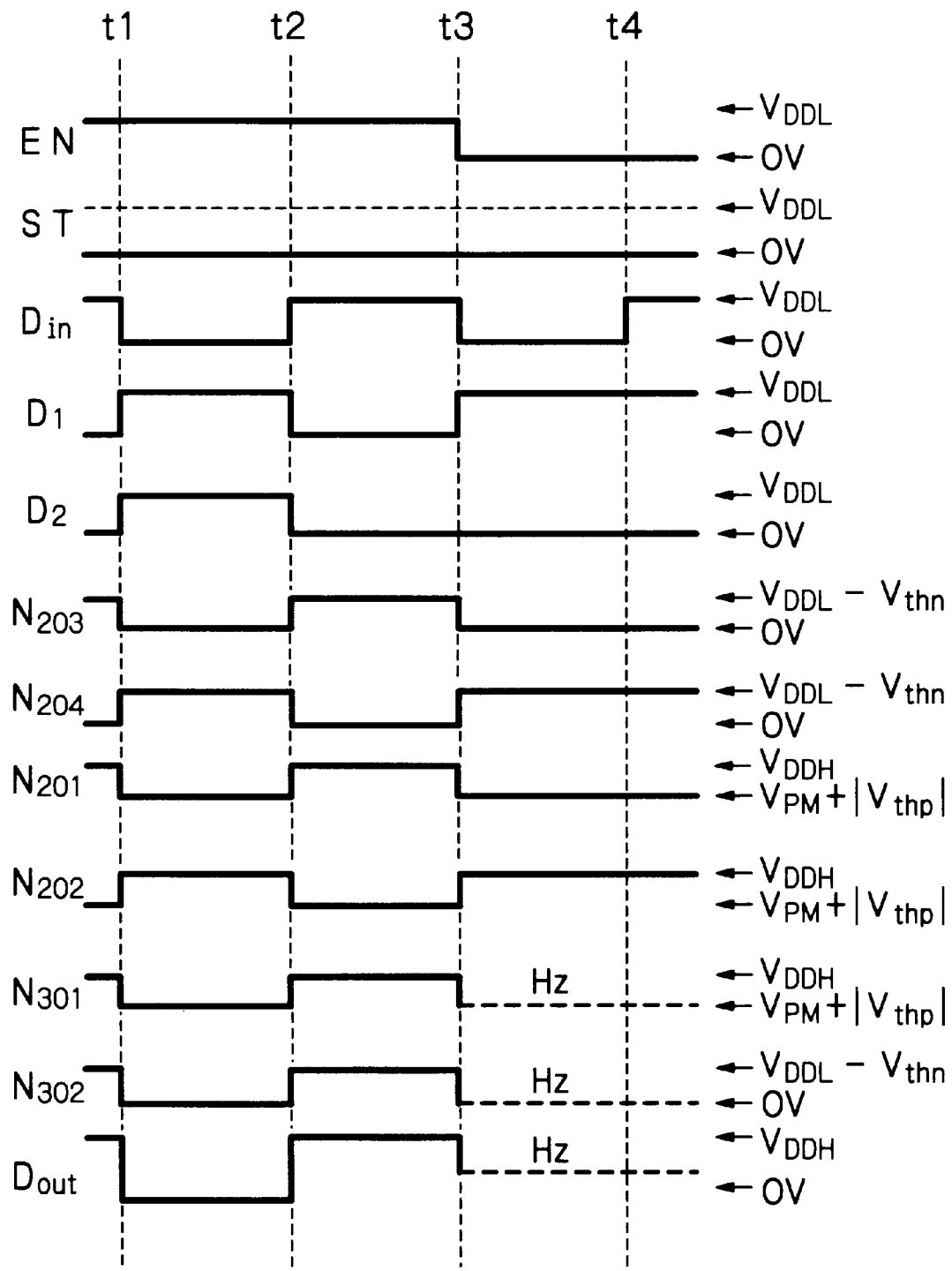
FIG. 5 is a timing diagram showing the operation of the circuit of FIG. 3.

As shown in FIG. 5, which is a timing diagram showing the operation of the output buffer circuit of FIG. 3, the state II of FIG. 4 occurs from time t1 to time t2, the state III of FIG. 4 occurs from time t2 to time t3, and the state I occurs from time t3.

Figure 6:
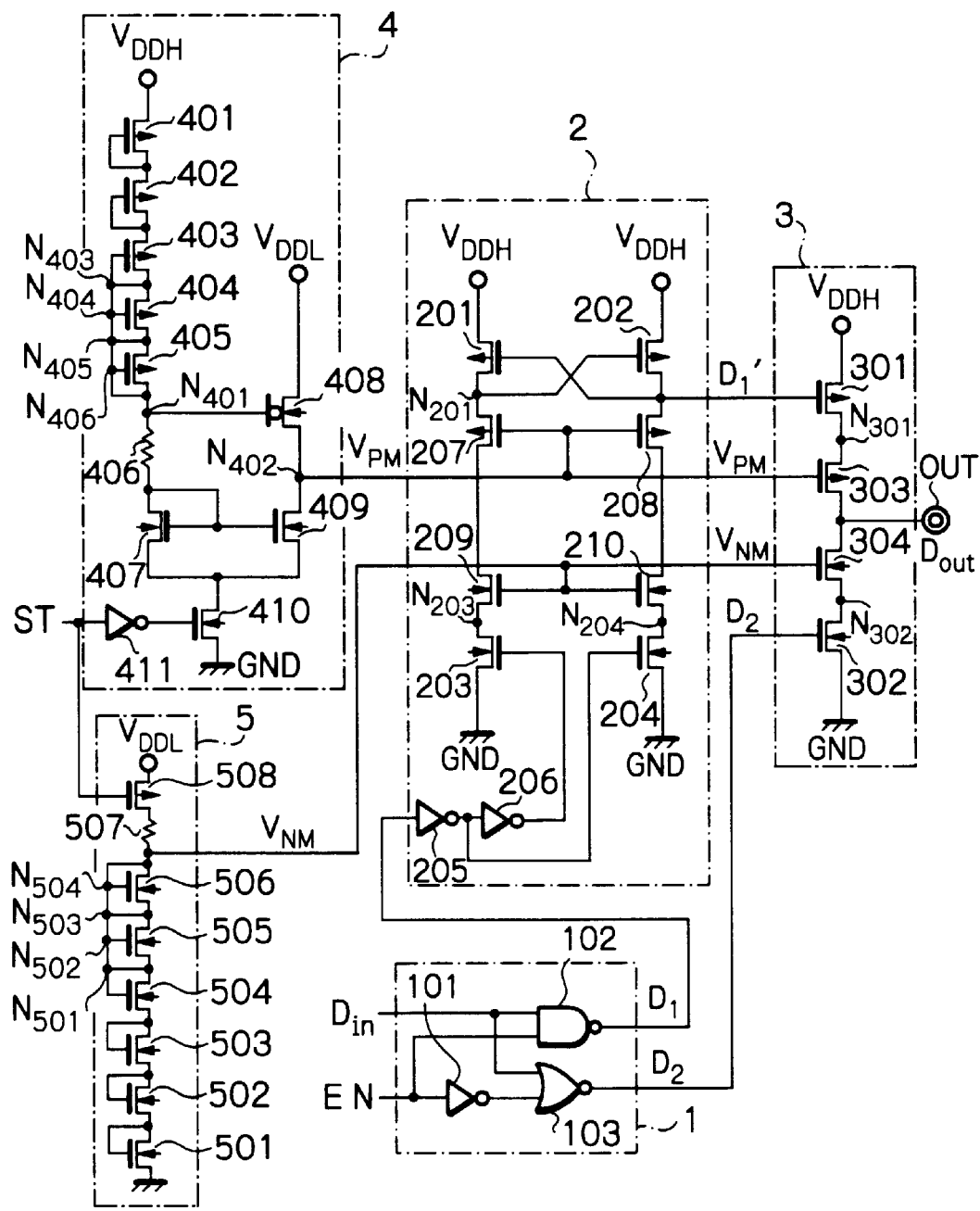
FIG. 6 is a circuit diagram illustrating a second embodiment of the output buffer circuit according to the present invention.

In FIG. 6, which illustrates a second embodiment of the present invention, an intermediate voltage generating circuit 5 is added to the element of the output buffer circuit of FIG. 3. That is, the intermediate voltage generating circuit 5 generates an intermediate voltage $V_{NM}$ instead of the intermediate voltage $V_{DDL}$ of FIG. 3 and transmits it to the level shift circuit 2 and the output circuit 3.

The intermediate voltage generating circuit 5 is constructed by a series of N-channel MOS transistors 501 through 506, a resistor 507 and an N-channel MOS transistor 508 controlled by the standby signal ST between the power supply voltage $V_{DDL}$ and the ground level GND. In this case, the transistors 501, 502, 503 and 504 are diode-connected, and the transistors 505 and 506 are short-circuited. Therefore, the intermediate voltage $V_{NM}$ is $4 \cdot V_{thn}$.

Note that, if a connection between nodes $N_{501}$ and $N_{502}$ is opened, the transistor 505 is diode-connected, and therefore, the intermediate voltage $V_{NM}$ is $5 \cdot V_{thn}$. If a connection between nodes $N_{503}$ and $N_{504}$ is opened, the transistor 506 is diode-connected, and therefore, the intermediate voltage $V_{NM}$ is $6 \cdot V_{thn}$.

Thus, the intermediate voltage $V_{NM}$ can be adjusted by opening the connections between the source-gate of the transistor 505 (506) using a laser trimming method or the like.

The operation of the output buffer circuit of FIG. 6 is substantially the same as that of the output buffer circuit of FIG. 3, as shown in FIG. 7. In FIG. 7, note that the voltage at the node $N_{302}$ in the state III is $V_{NM}-V_{thn}$.

As explained hereinabove, according to the present invention, since the voltage applied to the source-gate (gate-drain) of each of the transistors of the output buffer circuit is decreased, the output buffer circuit can be manufactured simultaneously with the internal circuit without a special manufacturing step, which can decrease the manufacturing cost.

What is claimed is:

1. An output buffer circuit comprising:

a low voltage power supply terminal for accepting a low voltage;

a first high voltage power supply terminal for accepting a first high voltage higher than the low voltage;

a second high voltage power supply terminal for accepting a second high voltage greater than the first high voltage;

a control circuit for receiving a data input signal and an enable signal, and for generating a first data signal and a second data signal, the first data signal and the second data signal each being equal to the logical complement of the data input signal when the enable signal is present, the first data signal and the second data signal each having a voltage level intermediate to the low voltage and the first high voltage;

a first intermediate voltage generation circuit for providing a second intermediate voltage;

a level-shifting circuit connected to said control circuit and to said first intermediate voltage generation circuit for receiving the first data signal and the second intermediate voltage, and for generating a third data signal having a voltage intermediate to a first intermediate voltage and the second high voltage; and an output circuit comprising first and second P-channel transistors connected in series between said second high voltage power supply terminal and an output terminal, and first and second N-channel transistors connected in series between said low voltage power supply terminal and said output terminal, said first P-channel transistor having a gate operatively connected to said level-shifting circuit to receive the third data signal, said second P-channel transistor having a gate operatively connected to said first intermediate voltage generation circuit to receive the second intermediate voltage, said first N-channel transistor having a gate operatively connected to said control circuit to receive the second data signal, said second N-channel transistor having a gate operatively connected to receive a third intermediate voltage; and a second intermediate voltage generating circuit for generating said third intermediate voltage, said second intermediate voltage generating circuit having a second series combination of a plurality of series short-circuited N-channel transistors and a plurality of series diode-connected N-channel transistors, said second series combination being connected between said low voltage power supply terminal and said first high voltage power supply terminal, and each of said plurality of series short-circuited N-channel transistors having a connection between its source and its gate, and a connection between its drain and its gate.

2. The output buffer circuit of claim 1, wherein the third intermediate voltage is equal to the first high voltage.

3. The output buffer circuit of claim 1, further comprising an open connection of one of said connections between a source and a gate, the open connection being provided to set the third intermediate voltage.

4. The output buffer circuit of claim 1, wherein said second intermediate voltage generation circuit further comprises a switch controlled by a standby signal, said switch being connected between said first high voltage power supply terminal and said second series combination for placing said second intermediate voltage generation circuit in a standby mode.

5. The output buffer circuit of claim 1, wherein said level-shifting circuit comprises:

a third and a fourth P-channel transistor cross-coupled with each other and connected to said second high power supply terminal, a drain of one of said third and said fourth P-channel transistors providing the third data signal;

fifth and sixth P-channel transistors connected to said third and said fourth P-channel transistors, respectively, said fifth and sixth P-channel transistors being operatively controlled by the second intermediate voltage;

third and fourth N-channel transistors connected to said low voltage power supply terminal, said third N-channel transistor being operatively controlled by the first data signal, said fourth N-channel transistor being operatively controlled by an inverted signal of the first data signal;

a fifth N-channel transistor connected between said fifth P-channel transistor and said third N-channel transistor and being operatively controlled by the third intermediate voltage; and a sixth N-channel transistor connected between said sixth P-channel transistor and said fourth N-channel transistor and being operatively controlled by the third intermediate voltage.

6. An output buffer circuit comprising:

a low voltage power supply terminal for accepting a low voltage;

a first high voltage Dower supply terminal for accepting a first high voltage hither than the low voltage;

a second high voltage power supply terminal for accepting a second high voltage greater than the first high voltage;

a control circuit for receiving a data input signal and an enable signal, and for generating a first data signal and a second data signal, the first data signal and the second data signal each being equal to the logical complement of the data input signal when the enable signal is present, the first data signal and the second data signal each having a voltage level intermediate to the low voltage and the first high voltage;

a first intermediate voltage generation circuit for providing a second intermediate voltage;

a level-shifting circuit connected to said control circuit and to said first intermediate voltage generation circuit for receiving the first data signal and the second intermediate voltage, and for generating a third data signal having a voltage intermediate to a first intermediate voltage and the second high voltage; and an output circuit comprising first and second P-channel transistors connected in series between said second high voltage power supply terminal and an output terminal, and first and second N-channel transistors connected in series between said low voltage power supply terminal and said output terminal, said first P-channel transistor having a gate operatively connected to said level-shifting circuit to receive the third data signal, said second P-channel transistor having a gate operatively connected to said first intermediate voltage generation circuit to receive the second intermediate voltage, said first N-channel transistor having a gate operatively connected to said control circuit to receive the second data signal, said second N-channel transistor having a rate operatively connected to receive a third intermediate voltage, said first intermediate voltage generation circuit comprising a first series combination of a plurality of series diode-connected P-channel transistors and a plurality of series short-circuited P-channel transistors, and wherein said first series combination is connected between said low voltage power supply terminal and said second high voltage power supply terminal, each of said plurality of series short-circuited P-channel transistors having a connection between its source and its gate, and a connection between its drain and its gate.

7. The output buffer circuit of claim 6, wherein said plurality of series short-circuited P-channel transistors are arranged to provide a desired second intermediate voltage by opening at least one of said connections between a source and a gate.

8. An output buffer circuit comprising:

a low voltage power supply terminal for accenting a low voltage;

a first high voltage power supply terminal for accenting a first high voltage higher than the low voltage;

a second high voltage Power supply terminal for accepting a second high voltage greater than the first high voltage;

a control circuit for receiving a data input signal and an enable signal, and for generating a first data signal and a second data signal, the first data signal and the second data signal each being equal to the logical complement of the data input signal when the enable signal is present, the first data signal and the second data signal each having a voltage level intermediate to the low voltage and the first high voltage;

a first intermediate voltage generation circuit for providing a second intermediate voltage;

a level-shifting circuit connected to said control circuit and to said first intermediate voltage generation circuit for receiving the first data signal and the second intermediate voltage, and for generating a third data signal having a voltage intermediate to a first intermediate voltage and the second high voltage; and an output circuit comprising first and second P-channel transistors connected in series between said second high voltage power supply terminal and an out-put terminal, and first and second N-channel transistors connected in series between said low voltage lower supply terminal and said output terminal, said first P-channel transistor having a gate operatively connected to said level-shifting circuit to receive the third data signal, said second P-channel transistor having a gate operatively connected to said first intermediate voltage generation circuit to receive the second intermediate voltage, said first N-channel transistor having a gate operatively connected to said control circuit to receive the second data signal, said second N-channel transistor having a rate operatively connected to receive a third intermediate voltage, said first intermediate voltage generation circuit comprising a first series combination of a plurality of series diode-connected P-channel transistors and a plurality of series short-circuited P-channel transistors, and wherein said first series combination is connected between said low voltage power supply terminal and said second high voltage power supply terminal, said first intermediate voltage generation circuit further comprising a switch controlled by a standby signal, said switch being connected between said low voltage power supply terminal and said first series combination for placing said first intermediate voltage generation circuit in a standby mode.

9. An output buffer circuit comprising:

a low voltage power supply terminal for accepting a low voltage;

a first high voltage power supply terminal for accepting a first high voltage hither than the low voltage;

a second high voltage power supply terminal for accepting a second high voltage greater than the first high voltage;

a control circuit for receiving a data input signal and an enable signal, and for generating a first data signal and a second data signal, the first data signal and the second data signal each being equal to the logical complement of the data input signal when the enable signal is present, the first data signal and the second data signal each having a voltage level intermediate to the low voltage and the first high voltage;

a first intermediate voltage generation circuit for providing a second intermediate voltage;

a level-shifting circuit connected to said control circuit and to said first intermediate voltage generation circuit for receiving the first data signal and the second intermediate voltage, and for generating a third data signal having a voltage intermediate to a first intermediate voltage and the second high voltage; and an output circuit comprising first and second P-channel transistors connected in series between said second high voltage power supply terminal and an output terminal, and first and second N-channel transistors connected in series between said low voltage power supply terminal and said output terminal, said first P-channel transistor having a gate operatively connected to said level-shifting circuit to receive the third data signal, said second P-channel transistor having a gate operatively connected to said first intermediate voltage generation circuit to receive the second intermediate voltage, said first N-channel transistor having a gate operatively connected to said control circuit to receive the second data signal, said second N-channel transistor having a gate operatively connected to receive a third intermediate voltage, said first intermediate voltage generation circuit comprising a first series combination of a plurality of series diode-connected P-channel transistors and a plurality of series short-circuited P-channel transistors, and wherein said first series combination is connected between said low voltage power supply terminal and said second high voltage power supply terminal, said first intermediate voltage generation circuit further comprising two N-type transistors, said two N-type transistors comprising a series N-type transistor and a current-mirroring N-type transistor connected in series between said first high voltage power supply terminal and said low voltage power supply terminal, said series N-type transistor having a gate connected to a drain of an end transistor of said plurality of series short-circuited P-channel transistors, wherein the second intermediate voltage is provided at a common node between said series N-type transistor and said current-mirroring N-type transistor.

10. An output buffer circuit comprising:

a low voltage power supply terminal for receiving a low voltage;

a first high voltage power supply terminal for receiving a first high voltage higher than the low voltage;

a second high voltage power supply terminal for receiving a second high voltage greater than the first high voltage;

a logic circuit for generating a first data signal and a second data signal having a voltage level intermediate the low voltage and the first high voltage;

a first intermediate voltage generation circuit for providing a second intermediate voltage, said first intermediate voltage generation circuit comprising a first series combination of a plurality of series diode-connected P-channel transistors and a plurality of series short-circuited P-channel transistors, said first series combination being connected between said low voltage power supply terminal and said second high voltage power supply terminal, each of said plurality of series short-circuited P-channel transistors having a connection between its source and its gate, and a connection between its drain and its gate;

a series N-type transistor and a current-mirroring N-type transistor connected in series between said first high voltage power supply terminal and said low voltage power supply terminal, said series N-type transistor having a gate connected to a drain of an end transistor of said plurality of series short-circuited P-channel transistors, the second intermediate voltage being provided at a common node between said series N-type transistor and said current-mirroring N-type transistor;

a level-shifting circuit connected to said control circuit and to said first intermediate voltage generation circuit for receiving the first data signal and the second intermediate voltage, and for generating a third data signal having a voltage between a first intermediate voltage and said second high voltage; and an output circuit comprising first and second P-channel transistors connected in series between said second high voltage power supply terminal and an output terminal, and first and second N-channel transistors connected in series between said low voltage power supply terminal and said output terminal, said first P-channel transistor having a gate operatively connected to said level-shifting circuit to receive the third data signal, said second P-channel transistor having a gate operatively connected to said intermediate voltage generation circuit to receive the second intermediate voltage, said first N-channel transistor having a gate operatively connected to said control circuit to receive the second data signal, and said second N-channel transistor having a gate operatively connected to receive a third intermediate voltage.

11. The output buffer circuit of claim 10, wherein said logic circuit is adapted to receive a data input signal and an enable signal, and to generate the first data signal and the second data signal each equal to the logical complement of the data input signal when the enable signal is present.

12. The output buffer circuit of claim 10, wherein the second intermediate voltage has been set by an opening in at least one of said connections between a source and a gate.

13. The output buffer circuit of claim 10, wherein said first intermediate voltage generation circuit further comprises a switch controlled by a standby signal, said switch being connected between said low voltage power supply terminal and said first series combination for placing said first intermediate voltage generation circuit in a standby mode.

14. The output buffer circuit of claim 10, wherein the third intermediate voltage is equal to the first high voltage.

15. The output buffer circuit of claim 10, wherein said level-shifting circuit comprises:

a third and a fourth P-channel transistor cross-coupled with each other and connected to said second high power supply terminal, a drain of one of said third and said fourth P-channel transistors providing the third data signal;

fifth and sixth P-channel transistors connected to said third and said fourth P-channel transistors, respectively, said fifth and sixth P-channel transistors being controlled by the second intermediate voltage;

third and fourth N-channel transistors connected to said low voltage power supply terminal, said third N-channel transistor being operatively controlled by the first data signal, said fourth N-channel transistor being operatively controlled by an inverted signal of the first data signal;

a fifth N-channel transistor connected between said fifth P-channel transistor and said third N-channel transistor and operatively controlled by the third intermediate voltage; and a sixth N-channel transistor connected between said sixth P-channel transistor and said fourth N-channel transistor and operatively controlled by the third intermediate voltage.

16. The output buffer circuit of claim 10, further comprising a second intermediate voltage generating circuit for generating the third intermediate voltage, said second intermediate voltage generating circuit having a second series combination of a plurality of series short-circuited N-channel transistors and a plurality of series diode-connected N-channel transistors, said second series combination being connected between said low voltage power supply terminal and said first high voltage power supply terminal, and each of said plurality of series short-circuited N-channel transistors having a connection between its source and its gate, and a connection between its drain and its gate.

17. The output buffer circuit of claim 10, wherein said second intermediate voltage generating circuit is designed and constructed to provide an adjustment of the third intermediate voltage by opening at least one of said connections between a source and a gate.

18. The output buffer circuit of claim 10, wherein said second intermediate voltage generation circuit further comprises a switch controlled by a standby signal, said switch being connected between said first high voltage power supply terminal and said second series combination for placing said second intermediate voltage generation circuit in a standby mode.

* * * * *